United States Patent
Nelson

[11] Patent Number: 6,037,603
[45] Date of Patent: Mar. 14, 2000

[54] OPTO-ELECTRONIC DEVICE WITH TRANSPARENT HIGH LATERAL CONDUCTIVITY CURRENT SPREADING LAYER

[75] Inventor: Andrew William Nelson, Cowbridge, United Kingdom

[73] Assignee: Epitaxial Products International Limited, Cardiff, United Kingdom

[21] Appl. No.: 09/082,870

[22] Filed: May 21, 1998

[51] Int. Cl.[7] .............................. H01L 29/06; H01L 33/00
[52] U.S. Cl. ................. 257/14; 257/21; 257/22; 257/94; 257/96; 257/103; 257/184
[58] Field of Search ................ 257/14, 21, 22, 257/94, 96, 103, 184; 372/45, 46

[56] References Cited

U.S. PATENT DOCUMENTS

| | | |
|---|---|---|
| 4,660,208 | 4/1987 | Johnston et al. . |
| 4,716,130 | 12/1987 | Johnston et al. . |
| 4,775,876 | 10/1988 | Moyer . |
| 5,008,718 | 4/1991 | Fletcher et al. . |
| 5,048,035 | 9/1991 | Sugawara et al. . |
| 5,115,286 | 5/1992 | Camras et al. . |
| 5,197,077 | 3/1993 | Harding et al. . |
| 5,359,209 | 10/1994 | Huang . |
| 5,466,950 | 11/1995 | Sugawara et al. ..................... 257/96 |

FOREIGN PATENT DOCUMENTS

| | | | |
|---|---|---|---|
| 0 334 637 A2 | 9/1989 | European Pat. Off. | ........ H01L 33/00 |
| 0 473 983 A2 | 3/1992 | European Pat. Off. | ........ H01L 33/00 |
| 2 250 862 | 6/1992 | United Kingdom | ............ H01L 33/00 |
| 2293 919 | 4/1996 | United Kingdom | ............ H01L 33/00 |

OTHER PUBLICATIONS

"The Growth and Properties of High Performance AlGaInP Emitters Using a Lattice Mismatched GaP Window Layer," by R. M. Fletcher, C. P. Kuo, T. D. Osentowski, K. H. Huang, and M. G. Craford, Hewlett–Packard Optoelectronics Division, San Jose, California 95131, 1991.

"Optimization of Electroluminescent Efficiencies For Vapor–Grown $GaAs_{1-x}P_x$ Diodes," by C. J. Nuese, J. J. Tietjen, J. J. Gannon, and H. F. Gossenberger, RCA Laboratories, Princeton, New Jersey, 1969.

Primary Examiner—Minh Loan Tran
Attorney, Agent, or Firm—Haynes and Boone, L.L.P.; Tim Headley

[57] ABSTRACT

An opto-electronic device, such as a light-emitting diode, comprises a transparent high lateral conductivity current spreading layer 31 overlying a conventional p-n junction active region 10. The current spreading layer 31 comprises a multiple quantum-well heterostructure having a plurality of thin layers 33 of a material having a band-gap narrower than the band-gap of the active region disposed between layers 32 of a material having a band-gap greater than or equal to the band-gap of the active region 10, the wide band-gap layers 32 being more highly doped than said narrow band-gap layers 33. Quantum confinement occurs in the narrow band-gap layers 33, so that it becomes transparent to light emitted from the active region 10. Furthermore, the layers 33 of narrow band-gap material become highly conductive owing to charge carriers which have transferred from the more highly doped wide band-gap material layers 32. The quantum-well heterostructure thus forms a transparent layer 31 which acts to spread current across the entire active region 10.

43 Claims, 5 Drawing Sheets

OPTO-ELECTRONIC DEVICE WITH TRANSPARENT HIGH LATERAL CONDUCTIVITY CURRENT SPREADING LAYER

BACKGROUND OF THE INVENTION

This invention relates to an opto-electronic device having a transparent high lateral conductivity current spreading layer.

PRIOR-ART

Light-emitting diodes or so-called LEDs are well known opto-electronic devices which are used for a wide variety of purposes such as in display indicators or as light sources in optical fibre communication systems. One such LED is shown in FIG. 1 and comprises a semiconductor wafer having an AlGaInP active region 10 which is epitaxially grown on a GaAs substrate 11. The AlGaInP active region 10 comprises an n-type lower confining layer 12, an undoped active layer 13 and a p-type upper confining layer 14. A metal contact layer 15 is applied to the back surface of the semiconductor wafer. A metal contact 16 is applied to the front surface of the wafer.

In use, a current I flows vertically through the wafer when a positive voltage is applied to the front contact 16 with respect to the back contact 15. This current I causes electrons and holes to be injected into the active layer 13 from the upper and lower confining layers 14,12 respectively. The electrons and holes recombine in the active layer and the energy lost on recombination is given off as photons.

A disadvantage of these LEDs is that the current I which flows vertically through the wafer is substantially laterally confined to the region below the front contact 16. Thus, photons are only generated in a small region 17 of the active layer that lies below the front contact 16. The front contact 16 thus blocks a large proportion of the photons emitted from the small region 17 of the active layer, thereby forming a small annular light output pattern P of reduced brightness.

EP 0 434 233 discloses an LED having improved brightness. Referring to FIG. 2 of the drawings, the LED is substantially similar to the LED of FIG. 1 and like parts are given like reference numerals. The layers 12,13,14 of the conventional active region 10 are capped by a current spreading layer 20 of a heavily-doped bulk semiconductor, such as GaAsP or GaP. The material of the current spreading layer 20 is transparent to light emitted from the active layer 13, because it has a band-gap which is greater than the band-gap of the active layer. The resistivity of the material of the current spreading layer 20 is low owing to the heavy doping, and thus the current flowing vertically through the device spreads out laterally over substantially the entire active region 10.

A disadvantage of this arrangement is that the current spreading layer has to be very thick (up to 50 $\mu$m) in order for the current to spread out sufficiently as it flows vertically through the wafer. Such thick layers of bulk semiconductor material are difficult, expensive and time consuming to grow. It will be appreciated that LEDs are commonly used components in electronic apparatus, and thus their price needs to be very low. Furthermore in order to achieve a high conductivity and transparency, the bulk materials used for the thick current spreading layer have to be of a certain type, and such materials have a crystal structure which does not match the crystal structure of the direct band-gap materials used in the active region 10. Hence, known high-intensity LEDs are unreliable owing to threading dislocations and stacking faults which occur near the lattice mismatched AlGaInP and GaP crystal interface, as a result of strain-relaxation in the thick layer.

We have now devised an opto-electronic device having a transparent high lateral conductivity current spreading layer which alleviates the above-mentioned problems.

SUMMARY OF THE INVENTION

In accordance with this invention there is provided an opto-electronic device comprising an active region disposed between first and second electrodes and a current spreading layer disposed between the active region and the second electrode, the active region being arranged to emit or absorb light, the current spreading layer comprising a quantum well heterostructure having at least one layer of a material having a band-gap narrower than the band-gap of said active region, disposed between layers of a material having a band-gap greater than or equal to the band-gap of said active region, said wide band-gap material being more highly doped than said narrow band-gap material.

The current spreading layer is arranged to be transparent to light emitted from or absorbed by the active region owing to the nature of the quantum-well heterostructure. It will be appreciated that the energy gap between the valence and conduction bands of a material defines the light absorption properties of that material. If the energy of the incident light is greater than this so-called band-gap then the energy is absorbed, and hence the material is opaque. On the other hand if the energy of the incident light is less than the band-gap, then the material is transparent. Obviously in layered materials the overall transparency is determined by the smallest band-gap material. However, in the quantum-well heterostructure the small band-gap material is preferably very thin, so that its energy bands become discrete energy levels, owing to an effect known as quantum confinement. The separation of these discrete energy levels is a function of the thickness of the layer, and hence the narrow band-gap material (which would normally absorb light below a given wavelength) becomes transparent when its thickness is reduced below a certain level.

The resistivity of a semiconductor material is determined by the number of free charge carriers and also the mobility of these carriers. If the number of charge carriers is increased, then their mobility is decreased owing to scattering of the carriers at the ionized donor/acceptor sites. However, in the quantum-well heterostructure of this invention, the free charge carriers in the more highly doped wide band-gap material will transfer into the narrow band-gap material, which is less highly doped and hence contains less ionized donor/acceptor sites. The narrow band-gap material is therefore highly conductive owing to the high mobility of these transferred charge carriers.

The current flowing through the device between the two electrical contacts thus spreads out owing to the charge carriers being primarily constrained within two-dimensional highly conductive sheets lying perpendicular to the direction of direct current flow.

The quantum-well heterostructure of the invention thus forms a transparent layer which acts to spread current across the entire active region. The current-spreading layer is lattice matched to the active region, so that defects do not occur.

The current spreading layer may be lattice matched or mismatched to the active layer, however in the latter case the quantum-well layers of the current spreading material are not sufficiently thick for damaging strain relaxation to occur.

Preferably the active region is lattice matched to the substrate. In one embodiment, the substrate comprises GaAs. Thus, the active region preferably comprises $Ga_{0.5}In_{0.5}P$ or $(Al_xGa_{1-x})_{0.5}In_{0.5}P$, which are materials that are lattice matched to the GaAs substrate. Preferably the wide band-gap material of the quantum-well heterostructure comprises AlAs, $Al_xGa_{1-x}As$ or $Al_{0.5}In_{0.5}P$, which are all materials that are lattice matched to the active region material. Preferably the narrow band-gap material comprises GaAs or $Al_xGa_{1-x}As$, which are materials that are lattice matched to both the active region material and to the wide band-gap material.

In an alternative embodiment, the substrate comprises InP. Thus, the active region preferably comprises $Ga_{0.47}In_{0.53}As$, $Ga_xIn_{1-x}As_yP_{1-y}(x\approx0.47y)$ or $(Al_xGa_{1-x})_{0.47}In_{0.53}As$, which are all materials that are lattice matched to the InP substrate. Preferably the wide band-gap material of the quantum-well heterostructure comprises InP, AlGaInAs or GaInAsP, which are all materials that are lattice matched to the active region material. Preferably the narrow band-gap material comprises $(Al_xGa_{1-x})_{0.4}In_{0.53}As$, $Ga_xIn_{1-x}As_yP_{1-y}(x\approx0.47y)$ or $Ga_{0.47}In_{0.53}As$, which are materials that are lattice matched to both the active region material and to the wide band-gap material.

It is further clear that the same basic operation could be achieved for non-lattice matched semiconductor layers provided that the same criteria for energy difference between the wider band-gap and narrower band-gap materials is maintained and that the total strain does not exceed the strain limits beyond which plastic relaxation of the layers occurs.

Preferably the device is a vertical cavity surface-emitting laser, an LED, or other light emitting device. Preferably the active region comprises a p-n junction which is arranged to emit light, the first electrical contact being connected to the active region via the substrate.

It will be appreciated that the high lateral conductivity current spreading layer will have wider applicability than for just lasers and LEDs. For example there are numerous optoelectronic devices which will require a transparent high conductivity contact layer which could usefully benefit from the present invention such as solar cells, photodiodes and phototransistors.

Preferably the narrow band-gap material is less than 150° Å thick, and most preferably less than 30 Å thick, so that it is made transparent to short wavelength light through quantum confinement effects.

Preferably the current spreading layer comprises a plurality of layers of said narrow band-gap material each being disposed between alternate layers of said wide band-gap material.

BRIEF DESCRIPTION OF THE DRAWINGS

An embodiment of this invention will now be described by way of example only, and with reference to the accompanying drawings, in which.

DETAILED DESCRIPTION

Figure 1:
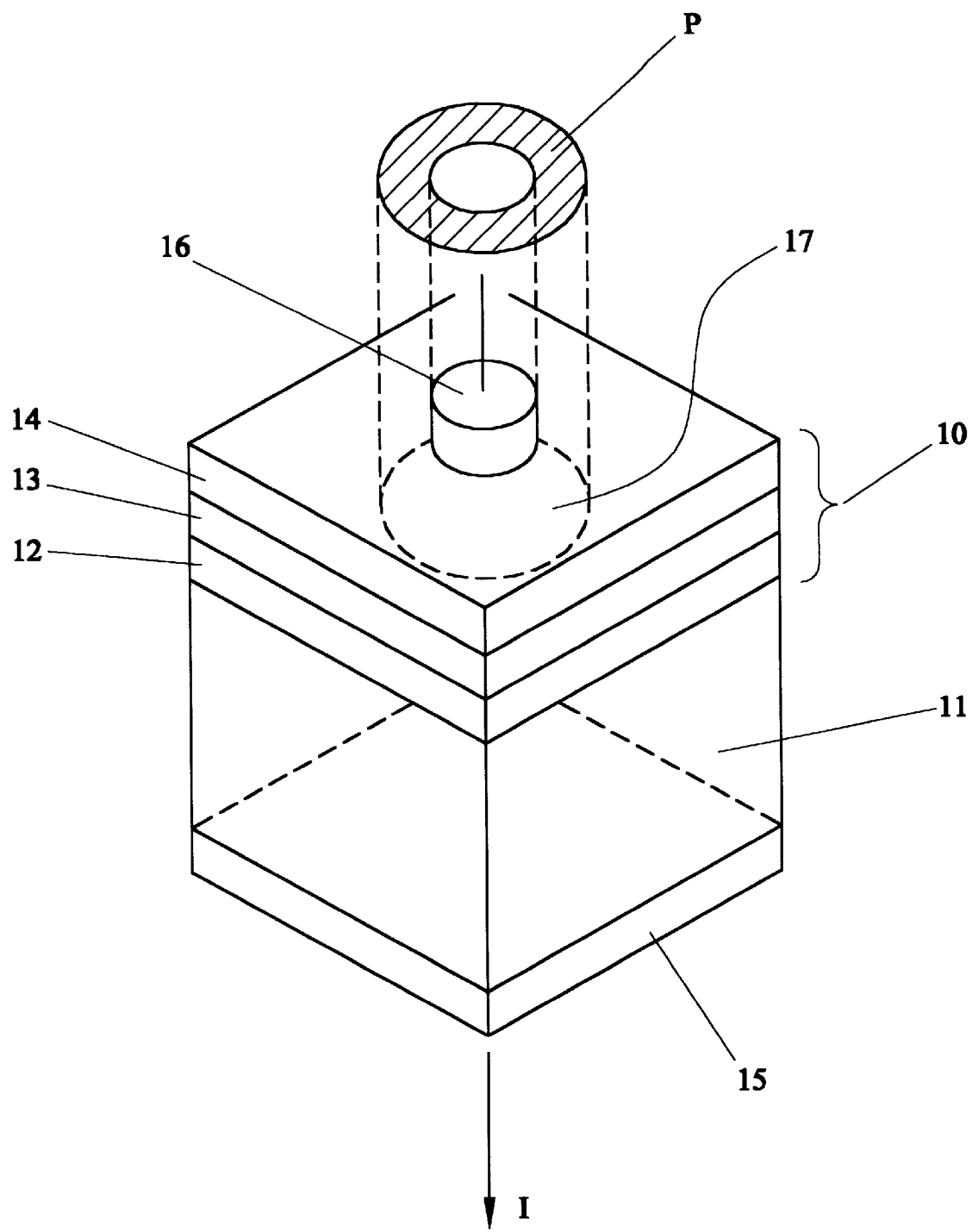
FIG. 1 is a perspective view of a conventional LED.
Figure 2:
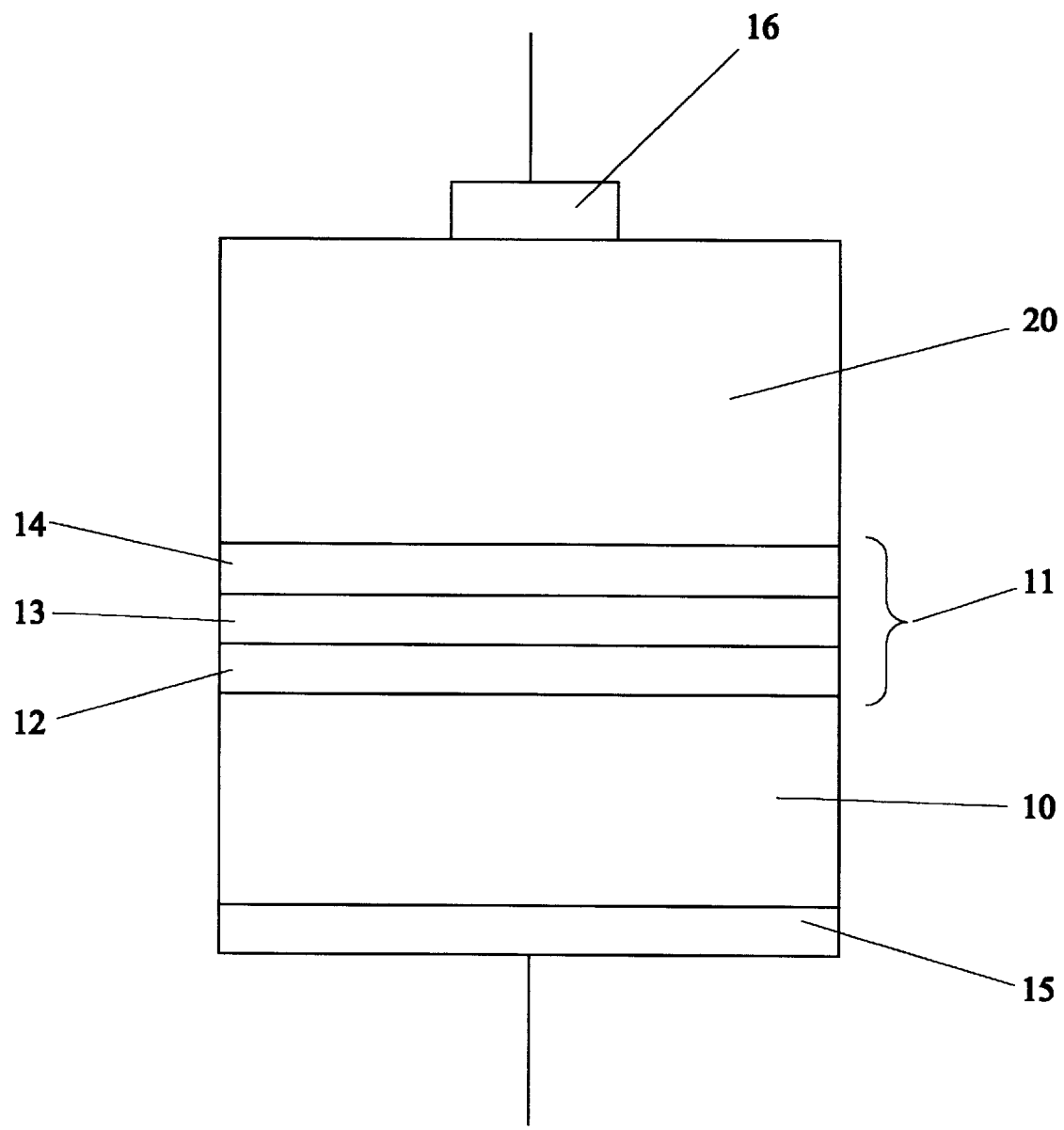
FIG. 2 is a sectional view through a conventional high-intensity LED.
Figure 3:
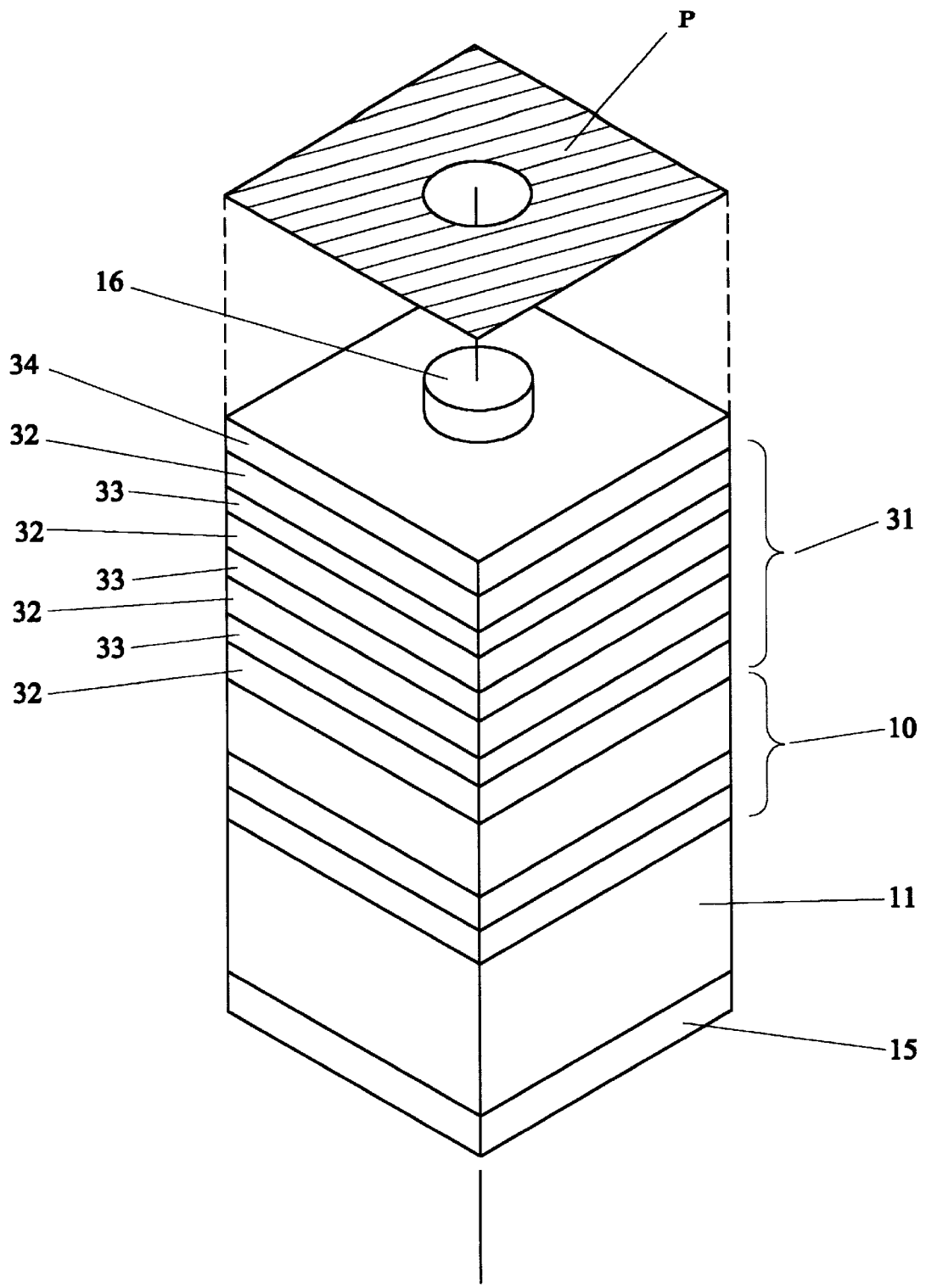
FIG. 3 is a sectional view through an LED in accordance with this invention.

Referring to FIG. 3 of the drawings, there is shown a light-emitting diode which is substantially similar to the LEDs of FIGS. 1 and 2 and like parts are given like reference numerals. A lattice-matched current spreading layer 31 is disposed on top of the conventional active region 10. The current spreading layer 31 has a multiple quantum-well (MQW) heterostructure comprising a plurality of thin layers of undoped narrow band-gap material 33 which are each disposed between respective layers of p-type wide band-gap material 32. A thin layer 34 of lattice mismatched GaP may be disposed on the uppermost layer of the MQW stack.

Figure 4:
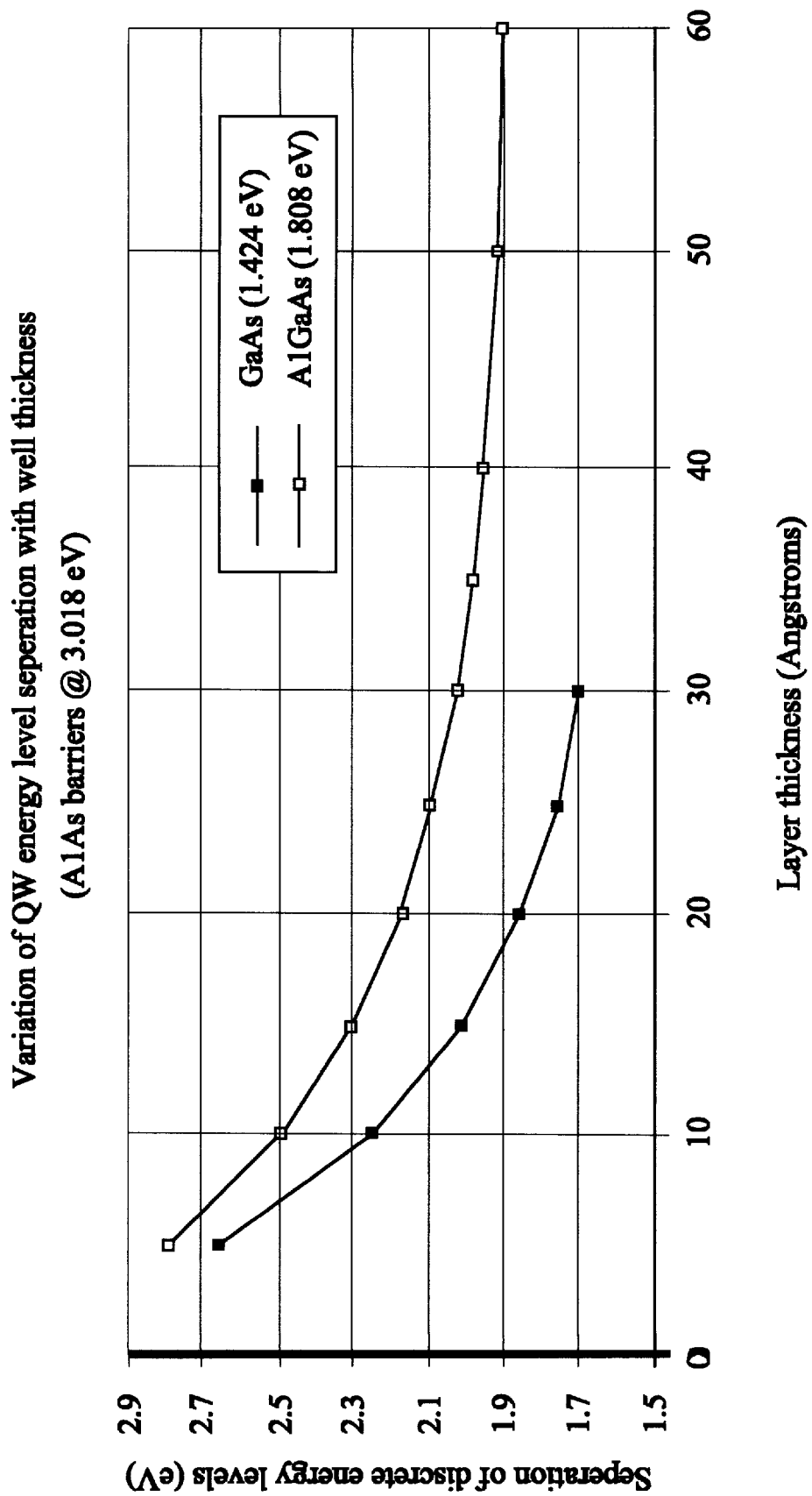
FIG. 4 is a graph of band-gap separation against layer thickness of a layer of the LED of FIG. 3.

Referring to FIG. 4, GaAs and $Al_xGA_{1-x}As$ (x=0 to 0.3) is a suitable narrow band-gap material having a normal energy band separation ($E_g$) varying from 1.424 eV to 1.808 eV according to the formula $$E_g=1.424+1.594x+\{0.59+0.64(2x-1)+0.098[(2x-1)^2+1]\}x(x-1)$$

Thus, $Al_{0.3}Ga_{0.7}As$ for example is only transparent to photons having an energy less than 1.808 eV. The energy of photons is equal to $hc/\lambda$ (where h is Plank's constant and c is the velocity of light), and hence $Al_{0.3}Ga_{0.7}As$ is only transparent to light having a wavelength greater than 686 nm in the infra-red to red part of the spectrum. However, the separation of the energy bands effectively increases when thin layers 33 of narrow band-gap material are sandwiched between layers 32 of a wide band-gap material such as AlAs, which has a band separation of 3.018 eV. Therefore, the narrow band-gap material layers 33 become transparent even to short wavelength light, such as green and blue when they are made sufficiently thin i.e. <18 Å.

Figure 5:
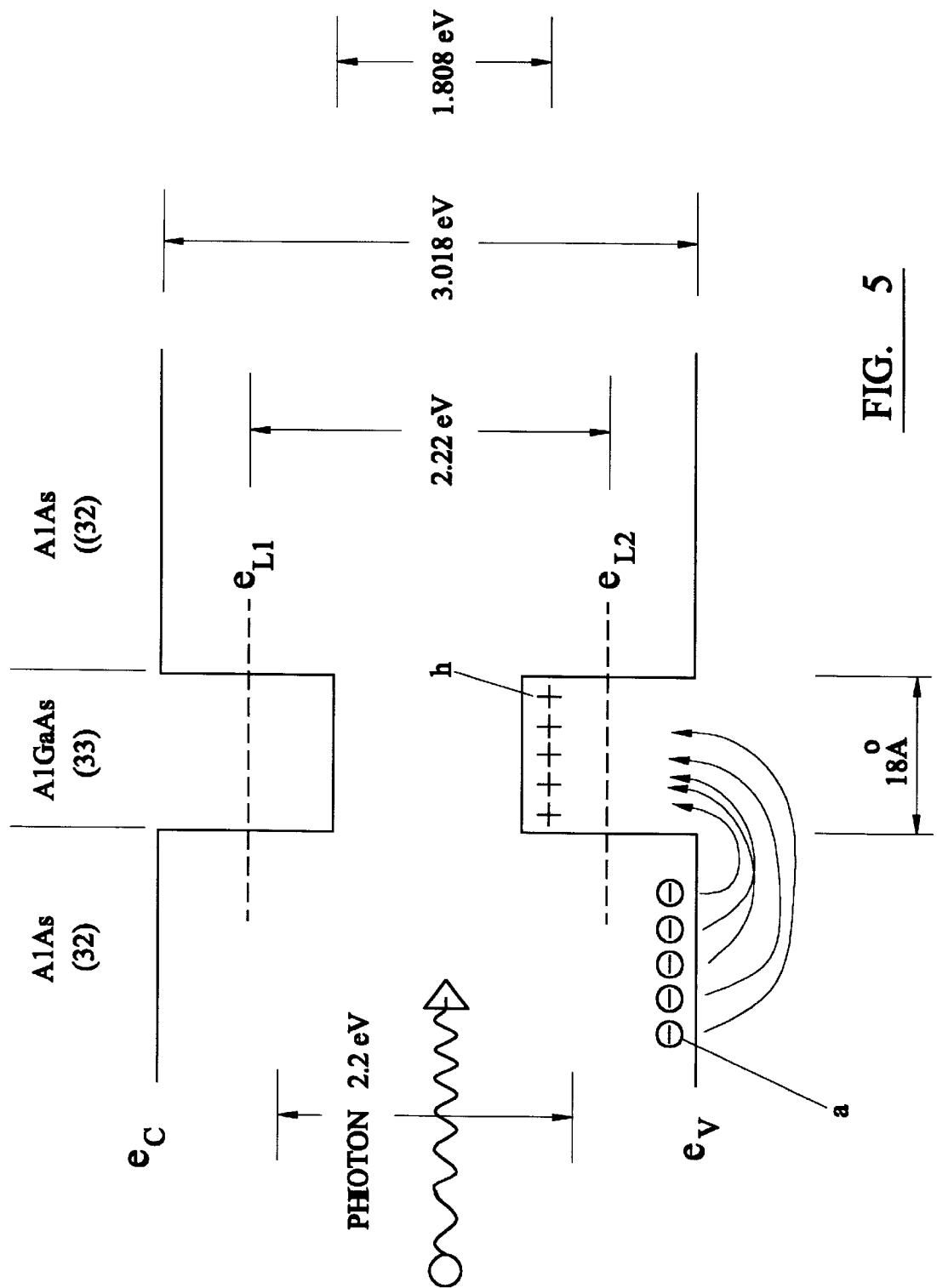
FIG. 5 is a energy band diagram of a portion of the quantum-well heterostructure of the LED of FIG. 3.

Referring to FIG. 5 of the drawings, there is shown the energy band diagram of a layer 33 of $Al_{0.3}GA_{0.7}As$ sandwiched between two layers 32 of AlAs. It can be seen that the conduction and valance bands $e_c$ and $e_v$ are separated by 1.808 eV in $Al_{0.3}Ga_{0.7}As$ and by 3.018 eV in AlAs. Thus, only the AlAs layer 32 is transparent to green light having a photon energy of 2.2 eV. However, the conduction and valance bands $e_c$ and $e_v$ in the $Al_{0.3}Ga_{0.7}As$ layer 33 are effectively pushed apart into two discrete energy levels $e_{L1}$ and $e_{L2}$ respectively. The separation between these levels is greater than 2.2 eV, so that the $Al_{0.3}Ga_{0.7}As$ layer 33 becomes transparent to the light.

In the above example the materials used are $Al_{0.3}GA_{0.7}As$ for the narrow band-gap layer and AlAs for the wide band-gap layer, however other combinations of the $Al_xGa_{1-x}As$ alloy may be used for each layer provided that the energy gap of the narrow band-gap layer is smaller than that of the active light-emitting layer, and provided that the energy gap of the wide band-gap layer is larger. Similarly other compounds such as $(Al_xGa_{1-x})_yIn_{1-y}P$ may be used provided that the individual layers satisfy this energy gap inequality. The thickness of the narrow band-gap layer will need to be varied in these cases to achieve the desired separation between energy levels $e_{L1}$ and $e_{L2}$.

In semiconductor materials the charge carriers (holes and electrons) will always try to achieve their lowest energy state. Thus, in energy band diagrams the holes float to the highest point in the valance band $e_v$ and the electrons sink to the lowest point in the conduction band $e_c$.

The AlAs layers 32 are heavily p-type doped, and thus the holes h move from the valance band $e_v$ of the AlAs layers 32 to the valance band $e_v$ of the $Al_{0.3}Ga_{0.7}As$ layers 33, thereby leaving ionized acceptor sites a in the AlAs layers 32. The holes h which are transferred to the $Al_{0.3}Ga_{0.7}As$ layers 33 are highly mobile, since their mobility is not restricted by ionized acceptor sites.

In use, when current flows between the front and back electrical contacts 16,15, the high conductive layers 33 of $Al_{0.3}Ga_{0.7}As$, lying perpendicular to the direction of current flow, cause the current to spread out laterally across the entire width of the wafer. Thus, photons are generated across the entire active region 10, thereby producing a broader output pattern P of light than conventional LEDs. Only a small proportion to this beam is blocked by the front metal contact 16. The current spreading layer can be configured so that it is transparent to short wavelength light, by adjusting the thickness of the narrow band-gap layer as described above.

I claim:

1. An opto-electronic device comprising an active region disposed between first and second electrodes and a current spreading layer disposed between the active region and the second electrode, the active region being arranged to emit or absorb light, the current spreading layer comprising a quantum-well heterostructure having at least one layer of a material having a band-gap narrower than the band-gap of said active region, disposed between layers of a material having a band-gap greater than or equal to the band-gap of said active region, said wide band-gap material being more highly doped than said narrow band-gap material.

2. An opto-electronic device as claimed in claim 1, comprising a substrate disposed between the first electrode and the active region.

3. An opto-electronic device as claimed in claim 2, in which the active region is lattice matched to the substrate.

4. An opto-electronic device as claimed in claim 3, in which the substrate comprises GaAs.

5. An opto-electronic device as in claim 4, in which the active region comprises $Ga_{0.5}In_{0.5}P$ or $(Al_xGa_{1-x})_{0.5}In_{0.5}P$.

6. An opto-electronic device as in claims 4 or 5, in which the wide band-gap material of the quantum-well heterostructure comprises AlAs, $Al_xGa_{1-x}As$ or $Al_{0.5}In_{0.5}P$.

7. An opto-electronic device as in claim 6, in which the narrow band-gap material comprises GaAs or $Al_xGa_{1-x}As$.

8. An opto-electronic device as in claim 6, in which the narrow band-gap material is less than 150° Å thick.

9. An opto-electronic device as in claim 6, in which the wide band-gap material is doped with a p-type dopant.

10. An opto-electronic device as in claim 6, in which the wide band-gap material is doped with an n-type dopant.

11. An opto-electronic device as claim 6, in which the current spreading layer comprises a plurality of layers of said narrow band-gap material each being disposed between alternate layers of said wide band-gap material.

12. A light emitting device as in claim 6, in which the active region comprises a p-n junction which is arranged to emit light.

13. A light absorbing device as in claim 6, in which the active region comprises a p-n junction which is arranged to absorb light.

14. An opto-electronic device as in claims 4 or 5, in which the narrow band-gap material comprises GaAs or $Al_xGa_{1-x}As$.

15. An opto-electronic device as in claim 14, in which the narrow band-gap material is less than 150° Å thick.

16. An opto-electronic device as in claim 14, in which the wide band-gap material is doped with a p-type dopant.

17. An opto-electronic device as in claim 14, in which the wide band-gap material is doped with an n-type dopant.

18. An opto-electronic device as claim 14, in which the current spreading layer comprises a plurality of layers of said narrow band-gap material each being disposed between alternate layers of said wide band-gap material.

19. A light emitting device as in claim 14, in which the active region comprises a p-n junction which is arranged to emit light.

20. A light absorbing device as in claim 14, in which the active region comprises a p-n junction which is arranged to absorb light.

21. An opto-electronic device as in claim 3, in which the substrate comprises InP.

22. An opto-electronic device as in claim 21, in which the active region comprises $Ga_{0.47}In_{0.53}As$, $Ga_xIn_{1-x}As_yP_{1-y}$ (x≈0.47y) or $(Al_xGa_{1-x})_{0.47}In_{0.53}As$.

23. An opto-electronic device as in claims 21 or 22, in which the wide band-gap material of the quantum-well heterostructure comprises InP, $(Al_xGa_{1-x})_{0.47}In_{0.53}As$ or $Ga_xIn_{1-x}As_yP_{1-y}(x≈0.47y)$.

24. An opto-electronic device as in claim 23, in which the narrow band-gap material comprises $(Al_xGa_{1-x})_{0.47}In_{0.53}As$, $Ga_xIn_{1-x}As_yP_{1-y}(x≈0.47y)$ or $Ga_{0.47}In_{0.53}As$.

25. An opto-electronic device as in claim 23, in which the narrow band-gap material is less than 150° Å thick.

26. An opto-electronic device as in claim 23, in which the wide band-gap material is doped with a p-type dopant.

27. An opto-electronic device as in claim 23, in which the wide band-gap material is doped with an n-type dopant.

28. An opto-electronic device as claim 23, in which the current spreading layer comprises a plurality of layers of said narrow band-gap material each being disposed between alternate layers of said wide band-gap material.

29. A light emitting device as in claim 23, in which the active region comprises a p-n junction which is arranged to emit light.

30. A light absorbing device as in claim 23, in which the active region comprises a p-n junction which is arranged to absorb light.

31. An opto-electronic device as in claims 21 or 22, in which the narrow band-gap material comprises $(Al_xGa_{1-x})_{0.47}In_{0.53}As$, $Ga_xIn_{1-x}As_yP_{1-y}(x≈0.47y)$ or $Ga_{0.47}In_{0.53}As$.

32. An opto-electronic device as in claim 31, in which the narrow band-gap material is less than 150° Å thick.

33. An opto-electronic device as in claim 31, in which the wide band-gap material is doped with a p-type dopant.

34. An opto-electronic device as in claim 31, in which the wide band-gap material is doped with an n-type dopant.

35. An opto-electronic device as in claim 31, in which the current spreading layer comprises a plurality of layers of said narrow band-gap material each being disposed between alternate layers of said wide band-gap material.

36. A light emitting device as in claim 31, in which the active region comprises a p-n junction which is arranged to emit light.

37. A light absorbing device as in claim 31, in which the active region comprises a p-n junction which is arranged to absorb light.

38. An opto-electronic device as in any of claims 1–5 or 21, 22, in which the narrow band-gap material is less than 150° Å thick.

39. An opto-electronic device as in any of claims 1–5 or 21, 22, in which the wide band-gap material is doped with a p-type dopant.

40. An opto-electronic device as in any of claims 1–5 or 21, 22, in which the wide band-gap material is doped with an n-type dopant.

41. An opto-electronic device as in any of claims 1–5 or 21, 22, in which the current spreading layer comprises a plurality of layers of said narrow band-gap material each being disposed between alternate layers of said wide band-gap material.

42. A light emitting device as in any of claims 1–5 or 21, 22, in which the active region comprises a p-n junction which is arranged to emit light.

43. A light absorbing device as in any of claims 1–5 or 21, 22, in which the active region comprises a p-n junction which is arranged to absorb light.

* * * * *